United States Patent
Chou (10) Patent No.: US 7,911,370 B2
(45) Date of Patent: Mar. 22, 2011

(54) PIPELINE ANALOG-TO-DIGITAL CONVERTER WITH PROGRAMMABLE GAIN FUNCTION

(75) Inventor: Yu-kai Chou, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 82 days.

(21) Appl. No.: 12/491,755

(22) Filed: Jun. 25, 2009

(65) Prior Publication Data

US 2010/0328129 A1    Dec. 30, 2010

(51) Int. Cl.
 *H03M 1/14*    (2006.01)
(52) U.S. Cl. ......... 341/162; 341/172; 341/139; 341/150
(58) Field of Classification Search .................. 341/139, 341/150, 161, 162, 172
See application file for complete search history.

(56) References Cited

U.S. PATENT DOCUMENTS

| | | | |
|---|---|---|---|
| 6,580,382 B2 | 6/2003 | Yung | |
| 6,958,655 B2 * | 10/2005 | Shirai | 330/282 |
| 7,061,420 B2 * | 6/2006 | Kobayashi et al. | 341/155 |
| 7,589,658 B2 * | 9/2009 | Ren et al. | 341/161 |
| 2007/0210951 A1 * | 9/2007 | Yamaji | 341/156 |
| 2009/0033535 A1 * | 2/2009 | Horie | 341/150 |

* cited by examiner

*Primary Examiner* — Howard Williams
(74) *Attorney, Agent, or Firm* — Kirton & McKonkie; Evan R. Witt (57) ABSTRACT

A pipeline analog-to-digital converter (ADC) comprises a plurality of pipeline stages is disclosed. The first pipeline stage has programmable gain function. The first pipeline stage includes a sub-analog-to-digital converter (sub-ADC) and a multiplying digital-to-analog converter (MDAC) implemented by switched capacitor (SC) circuits. Different capacitances in the sub-ADC and MDAC are provided so as to provide different gains by controlling switches in the SC circuits.

13 Claims, 8 Drawing Sheets

PIPELINE ANALOG-TO-DIGITAL CONVERTER WITH PROGRAMMABLE GAIN FUNCTION

TECHNICAL FIELD OF THE INVENTION

The present invention relates to an analog-to-digital converter (ADC), and more particularly, to a pipeline ADC with a programmable gain function.

BACKGROUND OF THE INVENTION

A widely used type of analog-to-digital converter is a so-called pipeline ADC. Taking a 12-bit pipeline ADC as an example, the 12-bit pipeline ADC comprises a sample-and-hold amplifier (SHA) for sampling an analog input and five pipeline stages, each of which generates digital bits corresponding to the amplitude of the analog input. Usually, the 12-bit ADC has an 8-level flash ADC connected in series with the stages. The five pipeline stages and the 8-level flash ADC pass outputs thereof to an error correction logic circuit to be combined in a shifting manner, and then a 12-bit digital output is generated accordingly.

Each pipeline stage of the pipeline ADC comprises a sub-ADC and a multiplying digital-to-analog converter (MDAC). The sub-ADC quantizes an analog input into a 3-bit output and passes the same to a sub-DAC of the MDAC. The output of the sub-DAC is subtracted from the analog input to obtain a difference. The difference is amplified by 4 times to generate a residue, which is passed to the next pipeline stage.

To add programmable gain function to the pipeline ADC, one method is to design an SHA with programmable gain function. Otherwise, an additional programmable gain amplification (PGA) stage is added in front of the SHA.

In some cases, such as low speed pipeline ADC designs, it is possible that the SHA is not used. Under such a condition, the pipeline ADC structure having an SHA with the programmable gain function cannot be implemented. In addition, it will be desirable if the PGA stage can be removed while the programmable gain function can be still provided.

SUMMARY OF THE INVENTION

An object of the present invention is to provide a pipeline ADC having programmable gain function without using an additional programmable gain amplifier (PGA).

In accordance with an embodiment of the present invention, a pipeline analog-to-digital converter comprises a plurality of pipeline stages for generating bits in correspondence to an analog input and an error correction logic circuit receiving the bits from the respective pipeline stages and combining the bits into a digital output, wherein the first pipeline stage is designed to have the programmable gain function. The first pipeline stage comprises a sub-analog-to-digital converter (sub-ADC) for receiving an input signal, selecting to provide a first gain or a second gain to the input signal and quantizing the gained input signal into bits; and a multiplying digital-to-analog converter (MDAC) receiving the input signal and the bits from the sub-ADC, providing the selected gain to the input signal, converting the bits into an analog result, subtracting the analog result from the gained input signal to generate a difference, and amplifying the difference to generate a residue. The sub-ADC and MDAC are implemented by switched capacitor (SC) circuits. In the sub-ADC and MDAC, different capacitances are provided to provide different gains by controlling switches in the SC circuits.

BRIEF DESCRIPTION OF THE DRAWINGS

The present invention will be described in detail in conjunction with the appending drawings, in which.

DETAILED DESCRIPTION OF THE INVENTION

Figure 1:
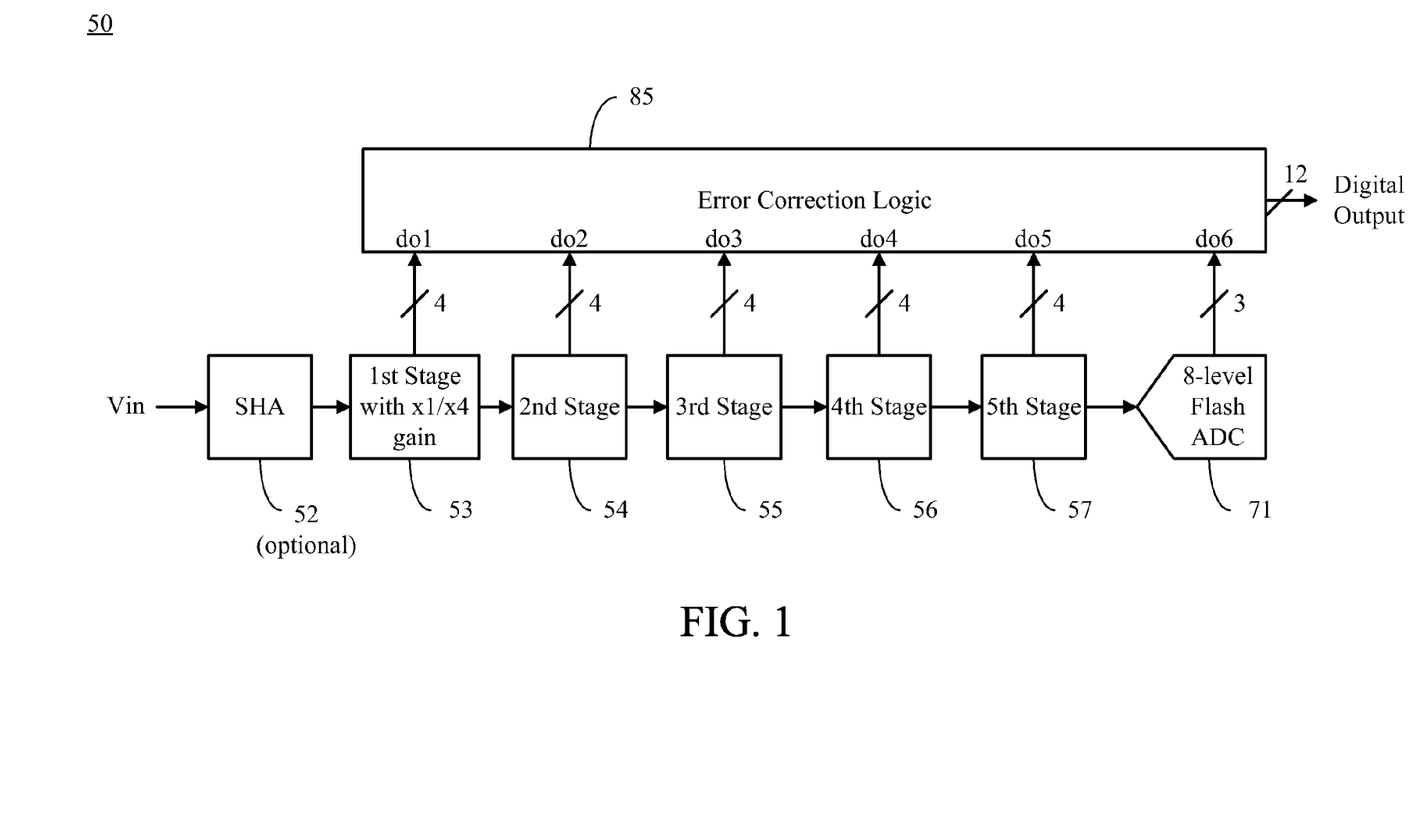
FIG. 1 is a schematic block diagram showing a 12-bit pipeline ADC according to an embodiment of the present invention.

FIG. 1 is a schematic block diagram showing a 12-bit pipeline ADC 50 according to an embodiment of the present invention. The ADC 50 comprises a sample-and-hold amplifier (SHA) 52 for sampling an analog input Vin and five pipeline stages 53 to 57, each of which generates digital bits corresponding to the amplitude of the analog input Vin. An 8-level flash ADC 71 is connected in series with the pipeline stages. The five pipeline stages 53 to 57 and the 8-level flash ADC 71 pass outputs do1 to do6 thereof to an error correction logic circuit 85. The error correction logic circuit 85 combines the outputs do1 to do6 in a shifting manner and generates a 12-bit digital output accordingly. It is noted that the sample-and-hold amplifier (SHA) 52 is optional. If the SHA 52 is not used, then the first stage 53 receives the analog input Vin directly.

According to the present invention, the programmable gain function is incorporated into one of the pipeline stages. In the present embodiment, the first pipeline stage 53 is designed to have the programmable gain function. For example, the first pipeline stage 53 can be switched between two gains: x1 and x4.

Figure 2:
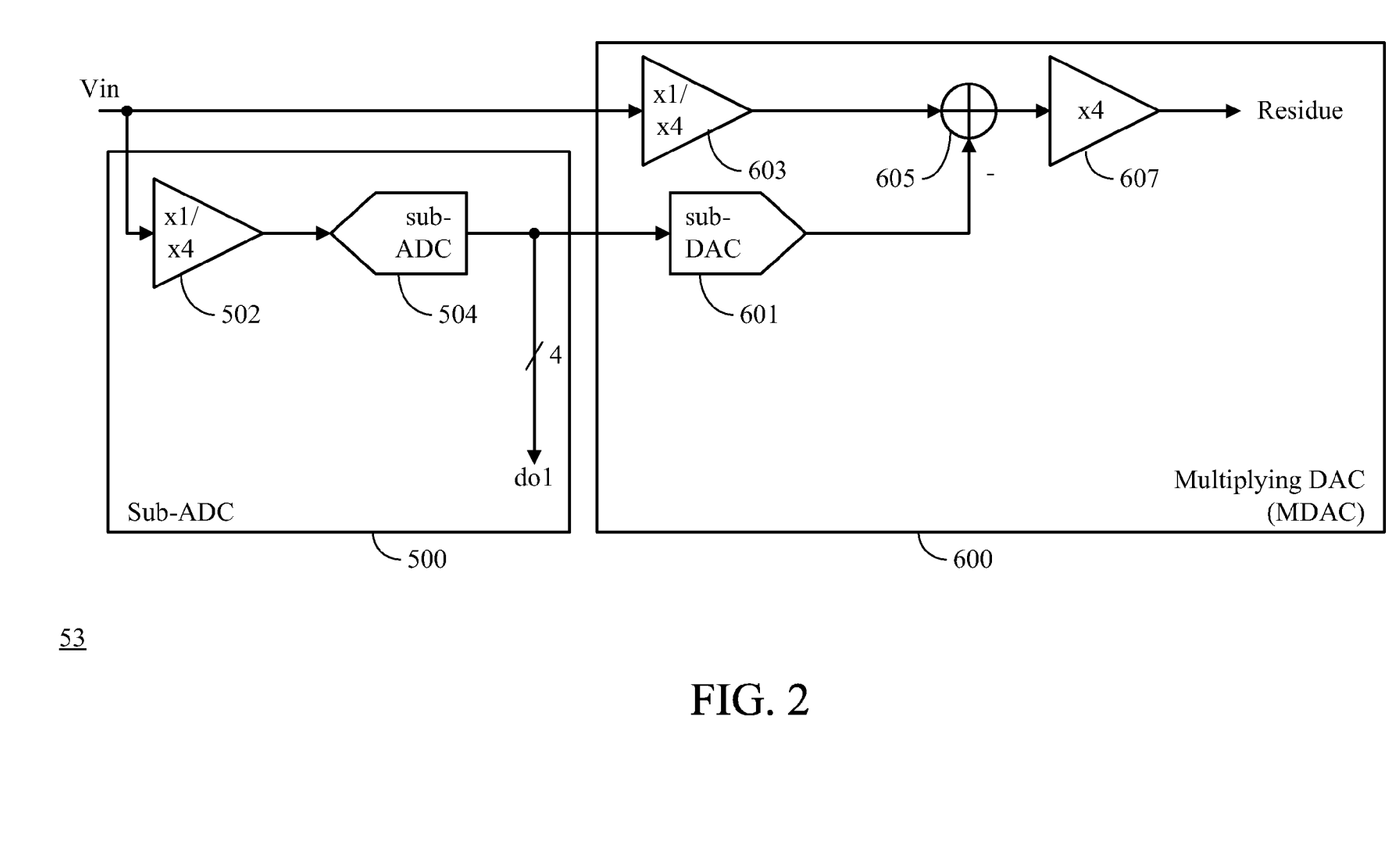
FIG. 2 schematically shows the functional structure of the first pipeline stage of the pipeline ADC in FIG. 1.

FIG. 2 schematically shows the functional structure of the first pipeline stage 53. The first pipeline stage 53 includes a sub-ADC 500 and an MDAC 600. The sub-ADC 500 has a programmable gain unit 502 and a sub-ADC unit 504. The MDAC 600 has a sub-DAC unit 601, a programmable gain unit 603, an adder 605 and a gain amplifier 607. The sub-ADC 500 amplifies an input signal Vin, herein is the output of the SHA 52, by a selected gain (e.g. x1 or x4) through the programmable gain unit 502 and quantizes the amplified signal by the sub-ADC unit 504 into a 3-bit output do1. The output do1 is also passed to the sub-DAC unit 601 of the MDAC 600 to generate an analog result. The analog result from the sub-DAC unit 601 is subtracted from the amplified Vin, which is amplified by the programmable gain unit 603 as mentioned above, by an adder 605 to obtain a difference. The difference is amplified by 4 times by a gain amplifier 607 to generate a residue, which is passed to the next pipeline stage (i.e. the second pipeline stage 54).

Figure 3:
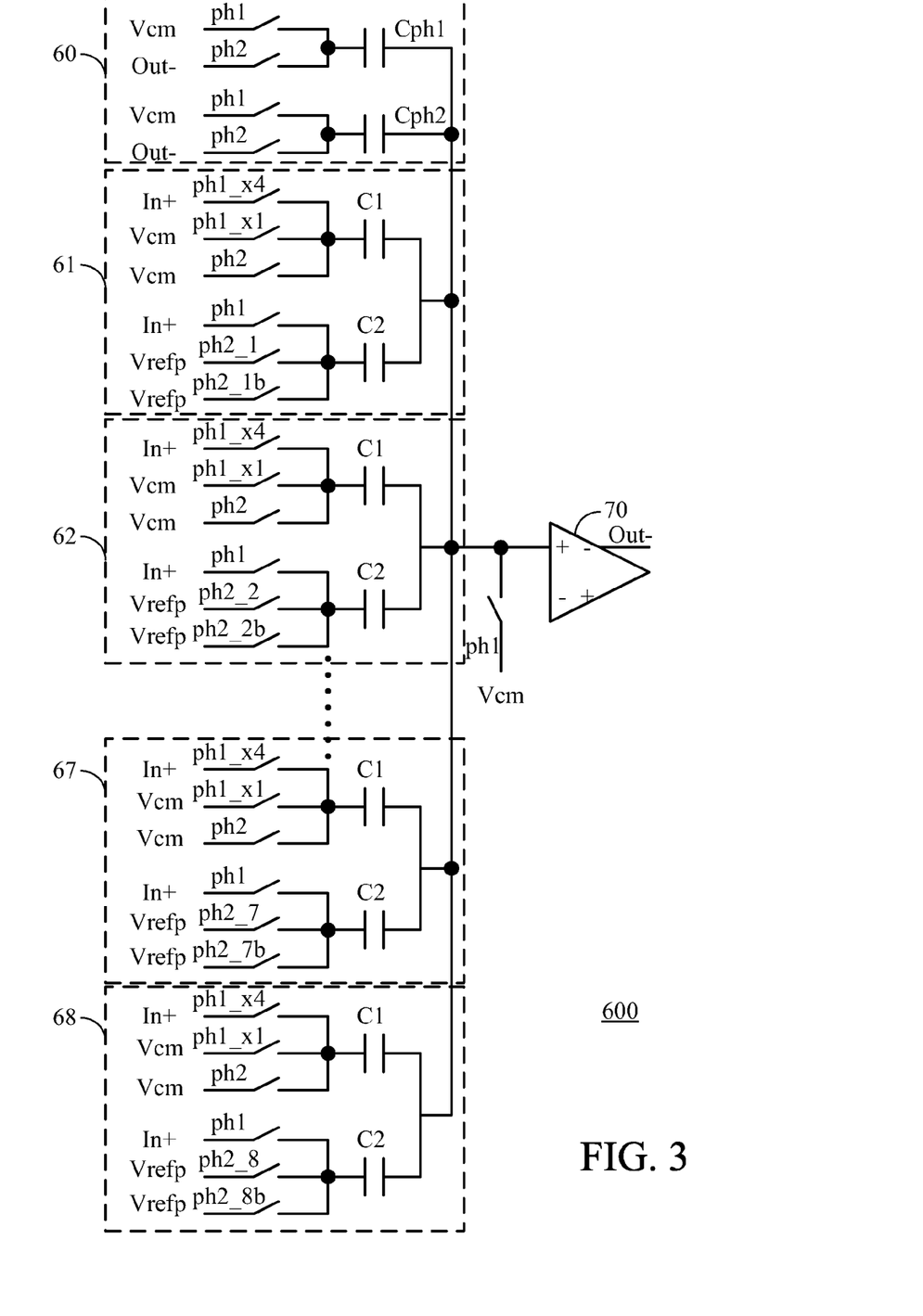
FIG. 3 is a circuit diagram showing a switched-capacitor circuit implementing a multiplying DAC (MDAC) of the first pipeline stage of the pipeline ADC in FIG. 1.

FIG. 3 is a circuit diagram showing a switched-capacitor circuit implementing the multiplying DAC (MDAC) 600 of the first pipeline stage 53 of the 12-bit pipeline ADC 50. As mentioned, the MDAC 600 comprises components such as a sub DAC, a programmable gain unit, an adder and a gain amplifier. The switched-capacitor (SC) circuit of FIG. 3 acts the equivalent functions as the combination of those components listed above.

The SC circuit implementing the MDAC 600 comprises a clock phase switching set 60 for switching between a first clock phase and a second clock phase. In the first clock phase, the MDAC 600 executes the sampling operation. In the second clock phase, the MDAC 600 executes the operations of subtracting and amplifying. As shown, the clock phase switching set 60 includes a pair of capacitors Cph1 and Cph2. First ends of the capacitors Cph1 and Cph2 are connected with an input terminal of an operational amplifier 70. Second ends of the capacitors Cph1, Cph2 are connected to a common voltage Vcm and a differential output (Out−) of the operational amplifier 70 via switches ph1 and ph2, respectively.

The SC circuit of FIG. 3 further includes eight multiplying DAC (MDAC) sets 61 to 68. The respective sets are also connected to the operational amplifier 70 as shown. Each MDAC set 61 to 68 respectively has a capacitor C1 and a capacitor C2. First ends of the capacitors C1 and C2 are connected to the operational amplifier 70. A second end of the capacitor C1 is connected to a differential input (In+) of the analog input signal Vin and Vcm via switches ph1_x4, ph1_x1, and ph2, respectively. A second end of the capacitor C2 is connected to In+, a first reference voltage Vrefp and a second reference voltage Vrefn via switches ph1, ph2_i, ph2_ib (i=1 to 8), respectively.

In the first clock phase, which is also referred to as a sample phase, if the programmed gain is set to be x1, then the switches ph1 and ph1_x1 are closed, while other switches are opened. If the programmed gain is set to be x4, then the switches ph1 and ph1_x4 are closed, while other switches are opened. In the second clock phase, which is also referred to as an amplify phase, the switches ph2 are closed. Either the switches ph2_i or switches ph2_ib are also closed depending on the fact that the analog input signal Vin is digitized to "1" or "0". Other switches are opened. The common voltage Vcm=(Vrefp−Vrefn)/2. Normally, Vrefp may be 0.8V, and Vrefn may be 0.3V, for example.

In the present embodiment, the ratio of capacitances of the capacitors Cph1, Cph2, C1, C2 is 1:1:3:1. The ratio of the capacitances of C1 to C2 is set as 3:1, since the programmable gain is switched between x1 and x4. For example, if the capacitance of C1 is 6C, then the capacitance of C2 should be 2C. Here "C" indicates a unit of capacitance. In this example, it is set that Cph1=Cph2=2C, C1=6C, C2=2C. The details will be further described later.

Figure 4A:
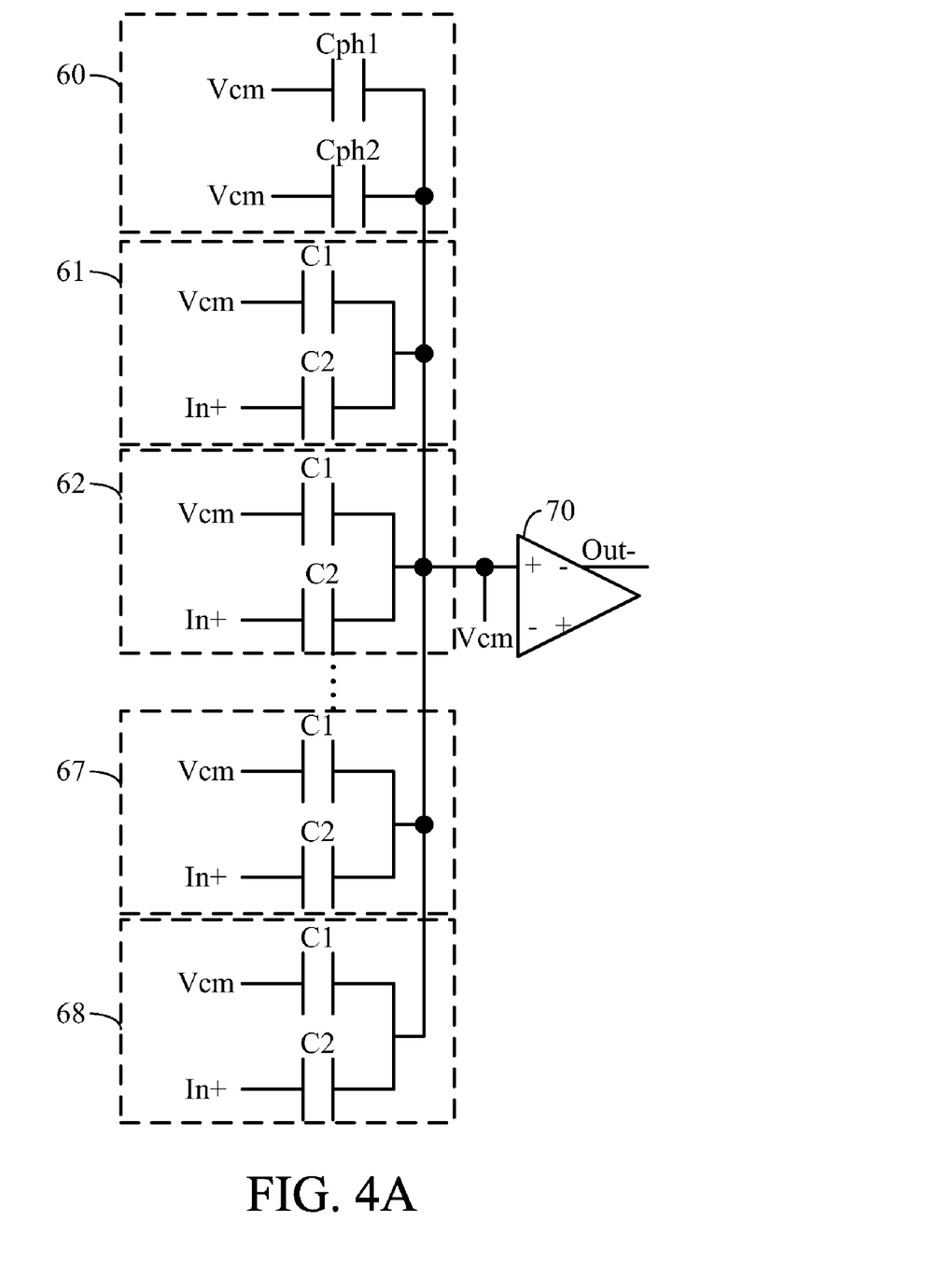
FIG. 4A and FIG. 4B respectively show the MDAC of FIG. 3 in a sample clock phase and an amplify clock phase when gain is set as 1.
Figure 4B:
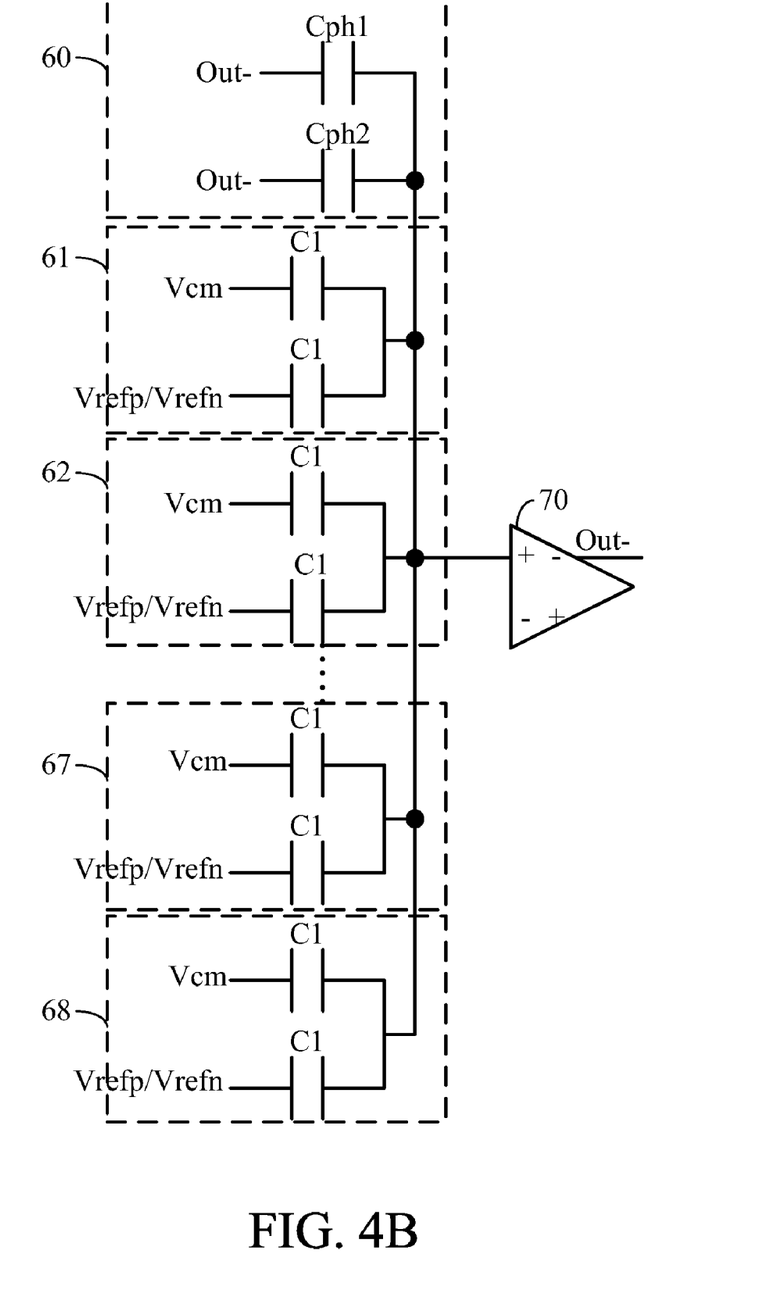

FIG. 4A and FIG. 4B respectively show the SC circuit implementing the MDAC 600 in the sample phase and the amplify phase when gain=1. In the sample clock phase, by controlling the switches, the two capacitors Cph1 and Cph2 of the clock phase switching set 60 are both connected to Vcm, that is, Cph1 and Cph2 are not used. The capacitor C1 of each MDAC set 61 to 68 is connected to Vcm, while the capacitor C2 is connected to In+. As can be seen, when gain=1, only C2 of each MDAC set 61 to 68 is used. If C1=6C, C2=2C, then the total capacitances of each MDAC set is 2C. In the amplify clock phase, by controlling the switches, the two capacitors Cph1 and Cph2 of the clock phase switching set 60 are both connected to Out−. The capacitor C1 of each MDAC set 61 to 68 is connected to Vcm, while the capacitor C2 is connected to Vrefp or Vrefn depending on the fact that the analog input signal Vin is digitized.

Figure 5A:
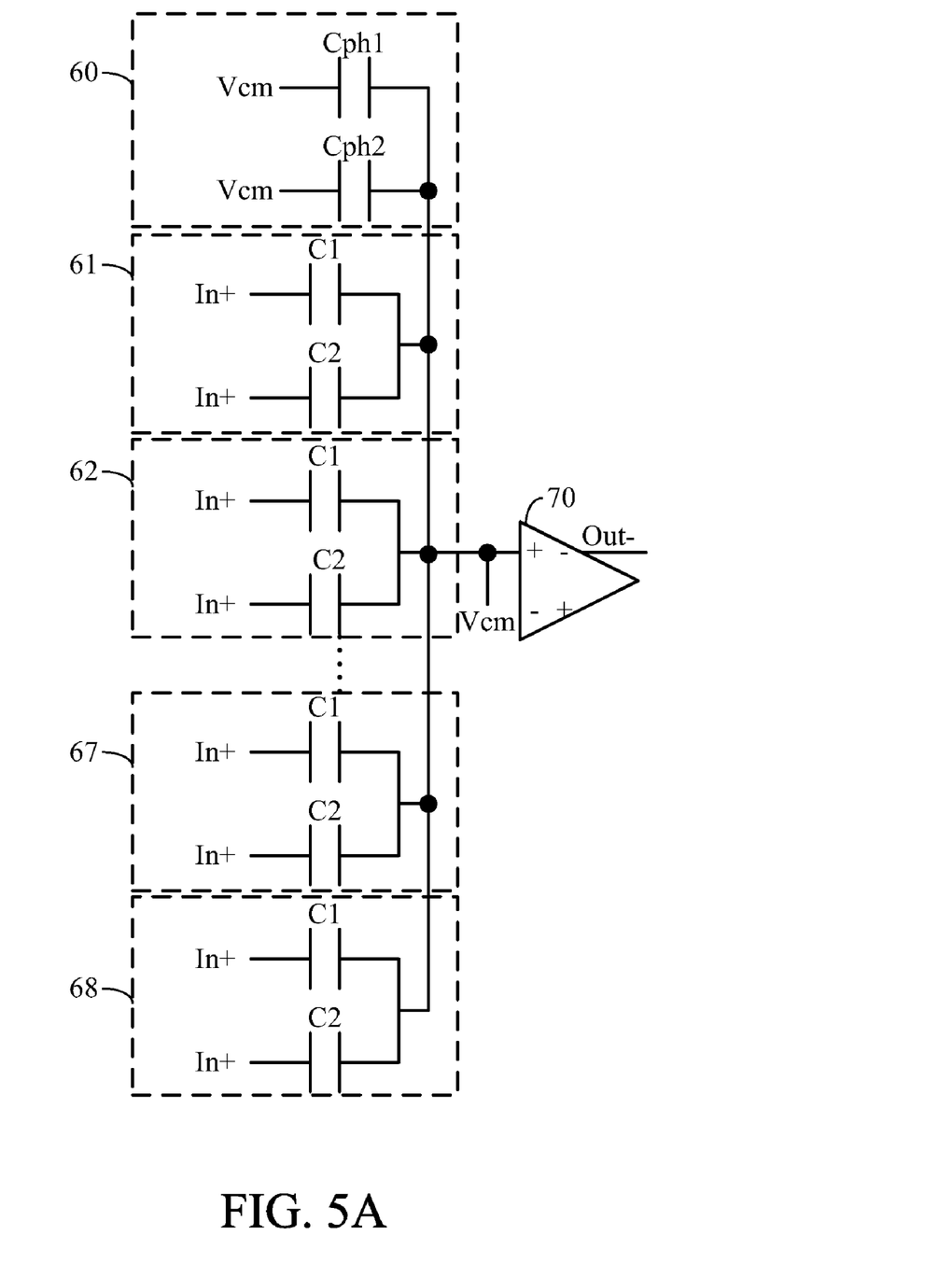
FIG. 5A and FIG. 5B respectively show the MDAC of FIG. 3 in a sample clock phase and an amplify clock phase when gain is set as 4.
Figure 5B:
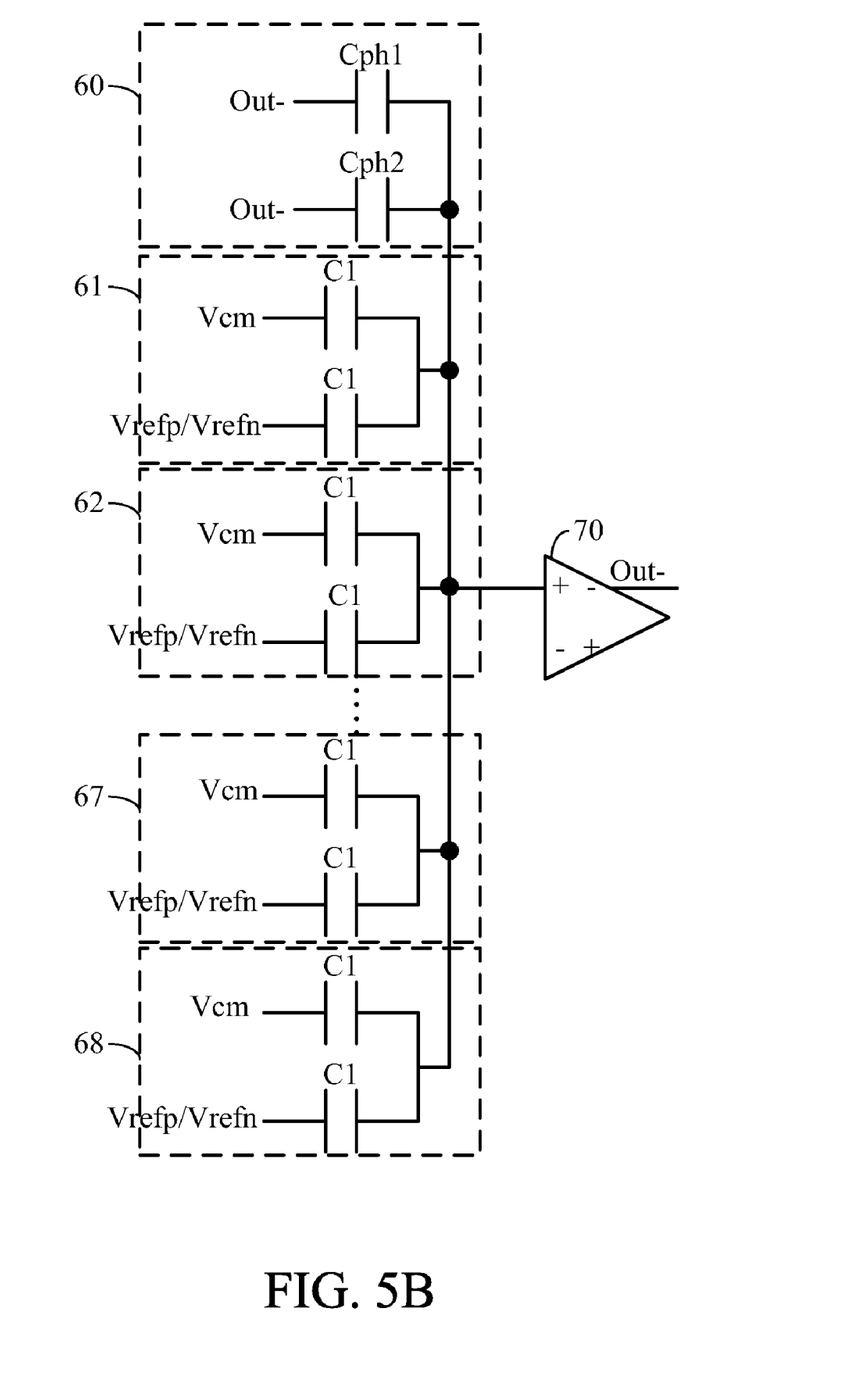

FIG. 5A and FIG. 5B respectively show the SC circuit implementing the MDAC 600 in the sample phase and the amplify phase when gain=4. In the sample phase, by controlling the switches, the two capacitors Cph1 and Cph2 of the clock phase switching set 60 are both connected to Vcm, that is, Cph1 and Cph2 are not used. Both the capacitors C1 and C2 of each MDAC set 61 to 68 are connected to In+. As can be seen, when gain=4, both C1 and C2 of each MDAC set 61 to 68 are used. If C1=6C, C2=2C, then the total capacitances of each programmable gain DAC set is 8C. In the amplify phase, by controlling the switches, the two capacitors Cph1 and Cph2 of the clock switching set 60 are both connected to Out−. The capacitor C1 of each MDAC set 61 to 68 is connected to Vcm, while the capacitor C2 is connected to Vrefp or Vrefn depending on the fact that the analog input signal Vin is digitized.

Figure 6:
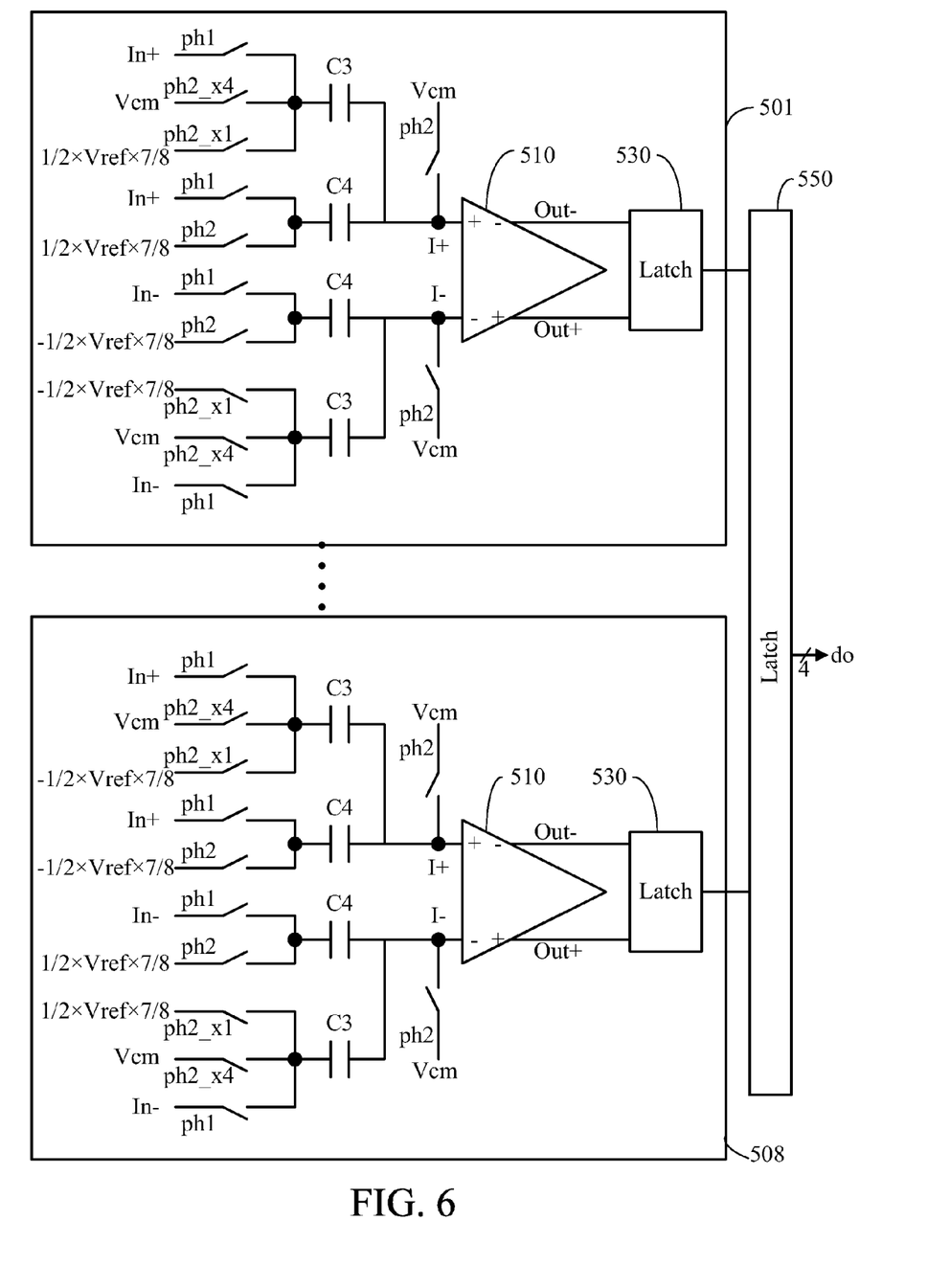
FIG. 6 is a circuit diagram showing a switched-capacitor circuit implementing a sub-ADC of the first pipeline stage of the pipeline ADC of FIG. 1.

FIG. 6 is a circuit diagram showing a switched-capacitor circuit implementing the sub-ADC 500 of the first pipeline stage 53 of the 12-bit pipeline ADC 50. The sub-ADC 500 includes eight ADC levels 501 to 508. The eight ADC levels 501 to 508 are connected to a latch 550. Each ADC level has an operational amplifier 510. The differential outputs (Out−, Out+) of the operational amplifier 510 are connected to a latch 530. A non-inverting input (I+) of the operational amplifier 510 is connected to a first end of a capacitor C3 and a first end of a capacitor C4. In the present embodiment, the capacitance ratio of the capacitor C3 to capacitor C4 is 3:1. If C3=3C, then C4=C. A second end of the capacitor C3 is connected to In+, Vcm, ½×Vref×⅞ via switches ph1, ph2_x4, ph2_x1, respectively; where Vref=Vrefp−Vrefn. A second end of the capacitor C4 is connected to In+ and ½×Vref×⅞ via switches ph1 and ph2, respectively. A inverting input (I−) of the operational amplifier 510 is connected to a first end of another capacitor C3 and a first end of another capacitor C4. A second end of this capacitor C3 is connected to In−, Vcm, −½×Vref×⅞ via switches ph1, ph2_x4, ph2_x1, respectively. A second end of this capacitor C4 is connected to In− and −½×Vref×⅞ via switches ph1 and ph2, respectively. In the first clock phase, the switches ph1 are closed, other switches are opened. The capacitors C3 and C4 are all connected to differential inputs In+ and In− of the analog input Vin to introduce Vin into the sub-ADC level. In the second clock phase, when gain=1, the switches ph2 and ph2_x1 are closed, other switches are opened. At this situation, the capacitors C3 and C4 are connected to the reference voltages ½×Vref×⅞ and −½×Vref×⅞, respectively as shown. The input total capacitance for each of the non-inverting and inverting inputs of the operational amplifier 510 is 3C+C=4C. When gain=4 in the second phase, the switches ph2 and ph2_x4 are closed, other switches are opened. At this situation, the capacitors C4 are connected to ½×Vref×⅞ and −½×Vref×⅞, respectively, while the capacitors C3 are connected to Vcm, that is, the capacitors C3 are not used. The input total capacitance for each of the non-inverting and inverting inputs of the operational amplifier 510 is C (i.e. that capacitance of C4).

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A multiplying digital-to-analog converter (MDAC) comprising:

an operational amplifier having a first input, a second input and an output;

a phase switching set connected to the first input of the operational amplifier for switching the MDAC between a sample phase and an amplify phase; and a plurality of MDAC sets connected to the first input of the operational amplifier, each MDAC set receiving an input signal, having a first capacitance so as to provide a first gain to the input signal or having a second capacitance so as to provide a second gain to the input signal in the sample phase.

2. The multiplying digital-to-analog converter of claim 1, wherein each MDAC set comprises a first capacitor and a second capacitor connected to the operational amplifier, the first capacitor is switched to an active mode so that the first capacitor and the second capacitor jointly provide the first capacitance for providing the first gain to the input signal, while the first capacitor is switched to an inactive mode so that the second capacitor alone provides the second capacitance for providing the second gain to the input signal.

3. The multiplying digital-to-analog converter of claim 2, wherein the first capacitor is connected to the input signal in the active mode while connected to a common voltage in the inactive mode and the second capacitor is connected to the input signal during the sample phase.

4. The multiplying digital-to-analog converter of claim 3, wherein the first capacitor is connected to the input signal via a first switch and connected to the common voltage via a second switch, the first switch is closed and the second switch is opened in the active mode, while the first switch is opened and the second switch is closed in the inactive mode.

5. A pipeline analog-to-digital converter (ADC) comprising:

a plurality of pipeline stages, wherein a first pipeline stage comprises:

a sub-analog-to-digital converter (sub-ADC) receiving an input signal, selecting to provide a first gain or a second gain to the input signal to generate a gained input signal, and quantizing the gained input signal into bits; and a multiplying digital-to-analog converter (MDAC) receiving the input signal and the bits from the sub-ADC, providing the selected gain to the input signal to generate a gained input signal, converting the bits into an analog result, subtracting the analog result from the gained input signal to generate a difference, and amplifying the difference to generate a residue, and wherein each of the other pipeline stages comprises:

a sub-analog-to-digital converter (sub-ADC) for receiving the residue from a previous pipeline stage and quantizing the residue into bits; and a multiplying digital-to-analog converter (MDAC) receiving the residue from the previous pipeline stage as an input and the bits from the sub-ADC, converting the bits into an analog result, subtracting the analog result from the input to generate a difference, and amplifying the difference to generate a new residue, and an error correction logic circuit receiving the bits from the pipeline stages and combining the bits into a digital output.

6. The pipeline analog-to-digital converter of claim 5, wherein the multiplying digital-to-analog converter (MDAC) of the first pipeline stage comprises:

an operational amplifier having a first input, a second input and an output; and a plurality of MDAC sets connected to a first input of the operational amplifier, each MDAC set receiving an input signal, providing a first capacitance so as to provide a first gain to the input signal and providing a second capacitance so as to provide a second gain to the input signal.

7. The pipeline analog-to-digital converter of claim 6, wherein each MDAC set comprises a first capacitor and a second capacitor connected to the operational amplifier, the first capacitor is switched to an active mode so that the first capacitor and second capacitor jointly provide the first capacitance for providing the first gain to the input signal, while the first capacitor is switched to an inactive mode so that the second capacitor alone provides the second capacitance for providing the second gain to the input signal.

8. The pipeline analog-to-digital converter of claim 7, wherein the first capacitor is connected to the input signal in the active mode while connected to a common voltage in the inactive mode, and the second capacitor is connected to the input signal.

9. The pipeline analog-to-digital converter of claim 8, wherein the first capacitor is connected to the input signal via a first switch and connected to the common voltage via a second switch, the first switch is closed and the second switch is opened in the active mode, while the first switch is opened and the second switch is closed in the inactive mode.

10. The pipeline analog-to-digital converter of claim 5, wherein the sub-analog-to-digital converter of the first pipeline stage comprises:

a latch; and a plurality of analog-to-digital converter (ADC) levels connected to the latch, wherein each ADC level comprises:

an operational amplifier having a first input, a second input, a first output and a second output, the outputs being coupled to the latch;

a first capacitance circuit connected to the first input of the operational amplifier for providing a third capacitance when the first gain is to be provided or providing a fourth capacitance when the second gain is to be provided to the input signal;

a second capacitance circuit connected the second input of the operation amplifier for providing the third capacitance when the first gain is to be provided or providing the fourth capacitance when the second gain is to be provided.

11. The pipeline analog-to-digital converter of claim 10, wherein each of the first and second capacitance circuit comprises a third capacitor and a fourth capacitor connected to the operational amplifier, the third capacitor is switched to an inactive mode and the fourth capacitor alone provides the third capacitance when the first gain is to be provided, while the third capacitor is switched to an active mode so that that the third capacitor and fourth capacitor jointly provide the fourth capacitance when the second gain is to be provided.

12. The pipeline analog-to-digital converter of claim 11, wherein the third capacitor is connected to a reference voltage in the active mode while connected to a common voltage in the inactive mode and the second capacitor is connected to the reference signal during the amplify phase.

13. The pipeline analog-to-digital converter of claim 12, wherein the third capacitor is connected to the common voltage via a third switch and connected to the reference voltage via a fourth switch, the third switch is closed and the second switch is opened in the inactive mode, while the third switch is opened and the fourth switch is closed in the active mode.

* * * * *